(12) United States Patent
Ma et al.

(10) Patent No.: US 9,269,686 B2
(45) Date of Patent: Feb. 23, 2016

(54) DEBOND INTERCONNECT STRUCTURES

(71) Applicant: Intel Corporation, Santa Clara, CA (US)

(72) Inventors: Qing Ma, Saratoga, CA (US); Jun He, Phoenix, AZ (US); Patrick Morrow, Portland, OR (US); Paul B. Fischer, Portland, OR (US); Sridhar Balakrishnan, Portland, OR (US); Satish Radhakrishnan, Hillsboro, OR (US); Tatyana T. Adryushchenko, Beaverton, OR (US); Guanghai Xu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 60 days.

(21) Appl. No.: 14/132,157

(22) Filed: Dec. 18, 2013

(65) Prior Publication Data
US 2014/0106560 A1    Apr. 17, 2014

Related U.S. Application Data

(62) Division of application No. 12/756,748, filed on Apr. 8, 2010, now Pat. No. 8,637,778.

(51) Int. Cl.
| | |
|---|---|
| *H05K 1/03* | (2006.01) |
| *H01L 23/00* | (2006.01) |
| *B23K 1/00* | (2006.01) |
| *H05K 3/40* | (2006.01) |

(52) U.S. Cl.
CPC .............. *H01L 24/19* (2013.01); *B23K 1/0016* (2013.01); *H01L 24/11* (2013.01); *H05K 3/4015* (2013.01); *H01L 2924/01322* (2013.01); *H05K 2201/1028* (2013.01)

(58) Field of Classification Search
None
See application file for complete search history.

(56) References Cited

U.S. PATENT DOCUMENTS

| | | | |
|---|---|---|---|
| 5,148,266 A | 9/1992 | Khandros et al. | |
| 5,518,964 A | 5/1996 | DiStefano et al. | |
| 5,801,441 A | 9/1998 | DiStefano et al. | |
| 5,989,936 A | 11/1999 | Smith et al. | |
| 6,763,579 B2 * | 7/2004 | Haba et al. | 29/842 |
| 6,824,959 B2 | 11/2004 | Olson et al. | |
| 6,965,158 B2 | 11/2005 | Smith et al. | |

(Continued)

FOREIGN PATENT DOCUMENTS

| | | |
|---|---|---|
| CN | 1956177 A | 5/2007 |
| CN | 101064321 A | 10/2007 |

(Continued)

OTHER PUBLICATIONS

Office Action received for Chinese Patent Application No. 201180017441.7, mailed on Sep. 3, 2014, 17 pages of Office Action including 9 pages of English Translation.

Office Action received for Korean Patent Application No. 10-2012-7024924, mailed on Sep. 13, 2013, 3 pages of English Translation and 4 pages of Korean Office Action.

International Preliminary Report on Patentability and Written Opinion received for PCT Patent Application No. PCT/US2011/030808, mailed on Oct. 18, 2012, 6 pages.

(Continued)

*Primary Examiner* — Dion R Ferguson
(74) *Attorney, Agent, or Firm* — Winkle, PLLC

(57) ABSTRACT

The present subject matter relates to the field of fabricating microelectronic devices. In at least one embodiment, the present subject matter relates to forming an interconnect that has a portion thereof which becomes debonded from the microelectronic device during cooling after attachment to an external device. The debonded portion allows the interconnect to flex and absorb stress.

9 Claims, 17 Drawing Sheets

(56) References Cited

U.S. PATENT DOCUMENTS

| | | |
|---|---|---|
| 7,114,250 B2 | 10/2006 | Haba et al. |
| 7,388,281 B2 | 6/2008 | Krueger et al. |
| 2002/0164893 A1 | 11/2002 | Mathieu et al. |
| 2004/0000426 A1 | 1/2004 | Olson et al. |
| 2004/0217003 A1 | 11/2004 | Haba et al. |
| 2008/0261026 A1 | 10/2008 | Kaneda et al. |

FOREIGN PATENT DOCUMENTS

| | | | |
|---|---|---|---|
| JP | 2002-503038 | A | 1/2002 |
| KR | 10-0721725 | B1 | 5/2007 |
| TW | 485665 | B | 5/2002 |
| WO | 99/40761 | A1 | 8/1999 |
| WO | 2011/126925 | A2 | 10/2011 |
| WO | 2011/126925 | A3 | 2/2012 |

OTHER PUBLICATIONS

International Search Report and Written Opinion received for PCT Patent Application No. PCT/US2011/030808, mailed on Dec. 9, 2011, 6 pages.
Hsu et al., "3-D Integrated Inductor on Silicon Backend Using Compliant Interconnect Process for 10GHz Low Jitter VCO Application", Electronic Components and Technology Conference, 2006, 6 pages.
Muthukumar et al., "High-Density Compliant Die-Package Interconnects", Electronic Components and Technology Conference, 2006, 6 pages.
Office Action received for Taiwan Patent Application No. 100112006, mailed on Jan. 1, 2015, 12 pages of Taiwan Office Action and 1 pages of English Search Report.
Office Action received for Chinese Patent Application No. 201180017441.7, mailed on May 15, 2015, 8 pages of Chinese Office Action including 2 pages of search report, and 9 pages of English translation including 2 pages of search report.

\* cited by examiner

DEBOND INTERCONNECT STRUCTURES

RELATED APPLICATION

The present application is a divisional of U.S. patent application Ser. No. 12/756,748, filed Apr. 8, 2010, and entitled "DEBOND INTERCONNECT STRUCTURES".

BACKGROUND OF THE INVENTION

Microelectronic devices are generally connected to external devices, such as printed circuit boards, with interconnects that have been formed on bond pads of the microelectronic devices. In order to mount the microelectronic device to the external device, the microelectronic device is positioned to align with corresponding bond pads on the external device and attached thereto. When the microelectronic device is attached to the external device with solder, the solder is reflowed, either by heat, pressure, and/or sonic energy to secure the microelectronic device interconnects to the external device bond pad.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
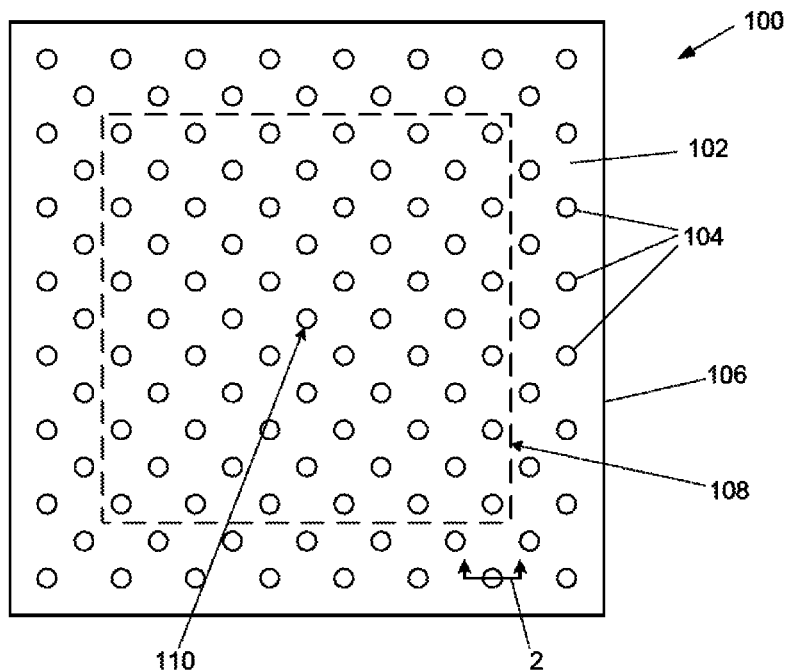
FIG. 1 illustrates a plan view of an attachment surface of a microelectronic device.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present subject matter relate to the fabrication of microelectronic devices. In at least one embodiment, the present subject matter relates to forming an interconnect that has a portion thereof which becomes debonded from the microelectronic device when presented with a predetermined amount of stress, generally during cooling after attachment to an external device. The debonded portion of the interconnect allows it to flex and absorb stress.

Figure 2:
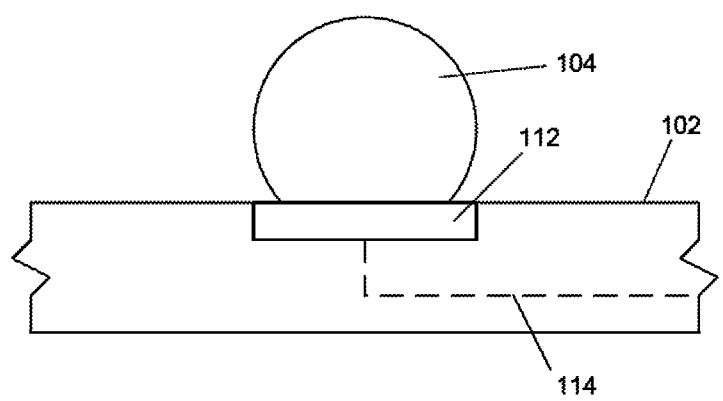
FIG. 2 illustrates a side cross-sectional view of an interconnect along line 2 of the microelectronic device of FIG. 1.

FIG. 1 is a plan view of an attachment surface 102 of microelectronic device 100, such as a microprocessor, a memory device, an application specific integrated circuit, or the like. Referring to FIGS. 1 and 2, a plurality of interconnects 104 (shown as solder balls) may be physically and electrically connected to bond pads 112 (see FIG. 2) proximate the microelectronic device attachment surface 102. The bond pads 112 may be physically and electrically connected to conductive traces (shown as dashed line 114), which route signals and/or power within integrate circuitry of the microelectronic device 100.

When the microelectronic device 100 is attached to an external device (not shown), such as a printed circuit board, the thermal expansion mismatch between the microelectronic device 100 and the external device can result in high shear stresses, particularly near the periphery 106 of the microelectronic device 100. The high shear stresses can result in bump shear (e.g. the interconnects 104 breaking free from the bond pad 112 or the external device (not shown)) and can result in interlayer dielectric cracking (not shown) within the microelectronic device 100, as will be understood to those skilled in the art. In general, the maximum shear stress levels are near the microelectronic device periphery 106 and decrease rapidly moving away from the microelectronic device periphery 106 toward a center 110 of the microelectronic device 100. In one embodiment, the shear stress levels are sufficiently low enough to not pose a risk of damage from bump shear or interlayer dielectric cracking at the dash line 108 and toward the center 110 of the microelectronic device 100.

Figure 3:
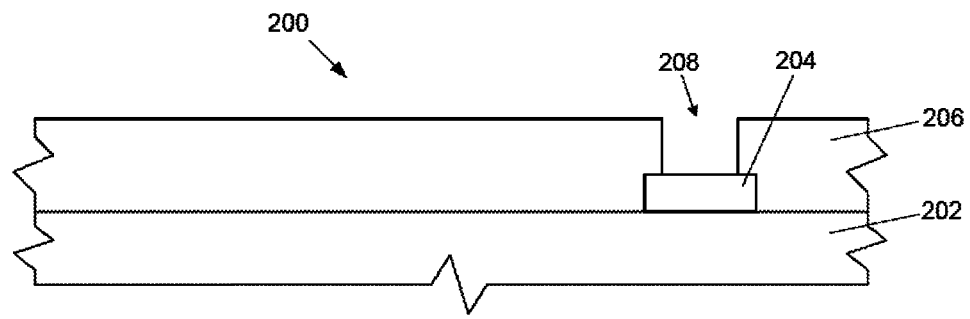
FIGS. 3-14 illustrate side cross-sectional views of one embodiment of a process of forming an interconnect.

An embodiment of the subject matter of the present description is shown in FIGS. 3-14. FIG. 3 illustrates a microelectronic device 200 comprising first dielectric layer 202 having a conductive trace 204 thereon. An outer dielectric layer 206 may be formed over the first electric layer 202 and the conductive trace 204, wherein a first opening 208 extends through the outer dielectric layer 206 to expose a portion of the conductive trace 204. The first dielectric layer 202 and/or the outer dielectric layer 206 may be a silicon oxide, silicon nitride, or low-K dielectric material (i.e. dielectric materials with a dielectric constant "K" lower than that of silicon oxide), including but not limited to carbon doped silicon dioxide and fluorine doped silicon dioxide. The first dielectric layer 202, the conductive trace 204, and the outer dielectric layer 206 may be formed by any known techniques, as will be understood by those skilled in the art.

Figure 4:
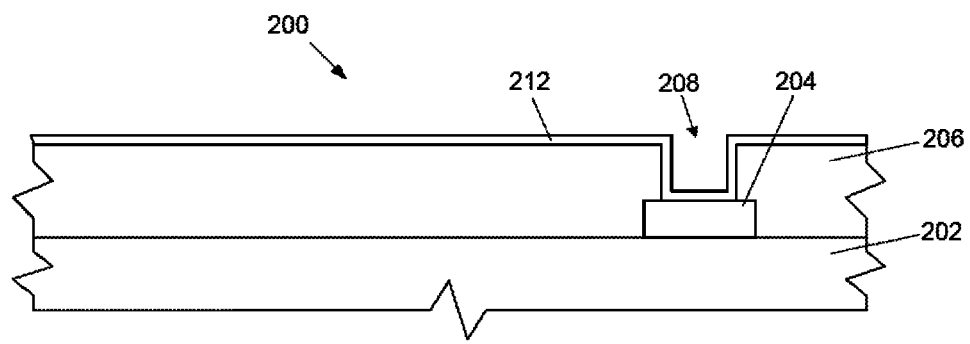

FIG. 4 illustrates a conductive adhesion layer 212, such as titanium and alloys thereof, formed over the outer dielectric 206 and into the first opening 208. The conductive adhesion layer 212 may be formed by any known deposition technique, including but not limited to, chemical vapor deposition, atomic layer deposition, physical vapor deposition, and the like.

Figure 5:
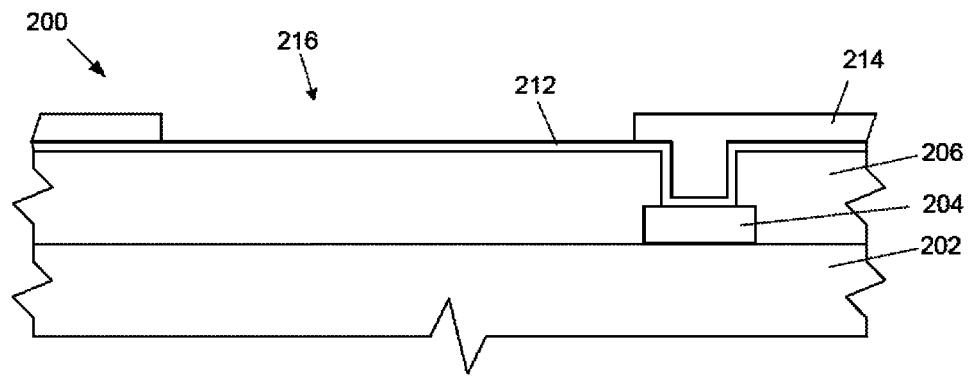
Figure 6:
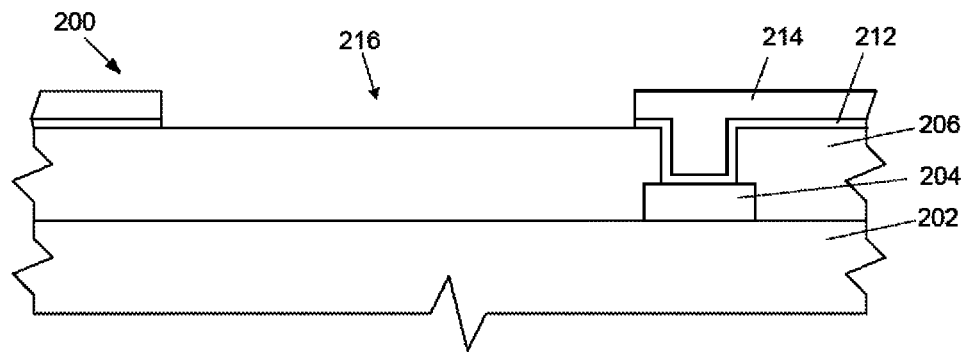
Figure 7:
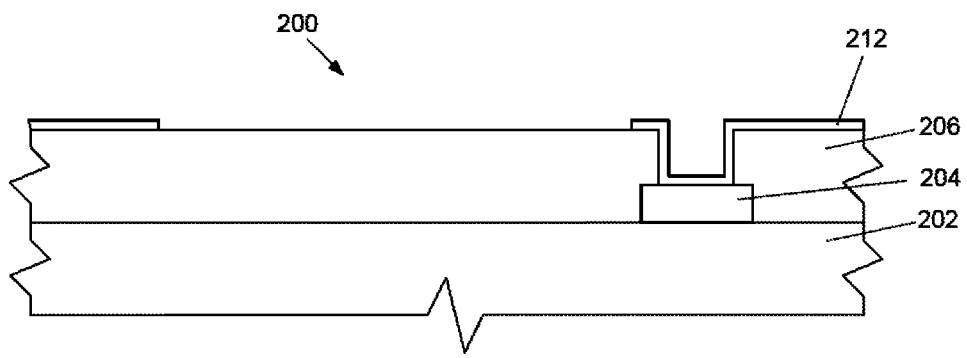

FIG. 5 illustrates a first mask 214 patterned on the conductive adhesion layer 212. A second opening 216 in the first mask 214 exposes a portion of the conductive adhesion layer 212 proximate the first opening 208 (see FIG. 4). The first mask 214 may be patterned in any manner known in the art, including but not limited to, known photolithography techniques with a photoresist material. As shown in FIG. 6, a portion of the conductive adhesion layer 212 exposed through the second opening 216 may be removed, as such by wet or dry etching techniques. The first mask 214 may then be removed by any known technique, such as by chemical stripping or ashing (oxygen and/or fluorine), as shown in FIG. 7.

Figure 8:
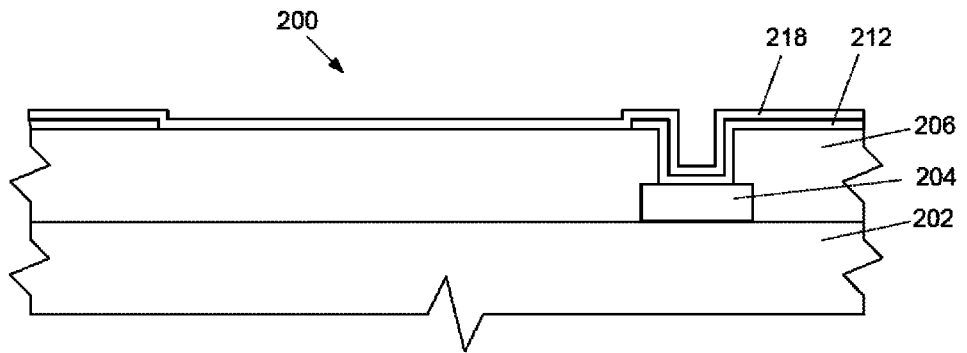

As shown in FIG. 8, a seed layer 218 may be deposited over the exposed portions of the outer dielectric layer 206 and the remaining conductive adhesion layer 212. The seed layer 218 may be a metal, including but not limited to copper, silver, aluminum, gold, and alloys thereof. The seed layer 218 may be formed by any known deposition technique, including but not limited to including but not limited to, chemical vapor deposition, atomic layer deposition, physical vapor deposition, and the like.

Figure 9:
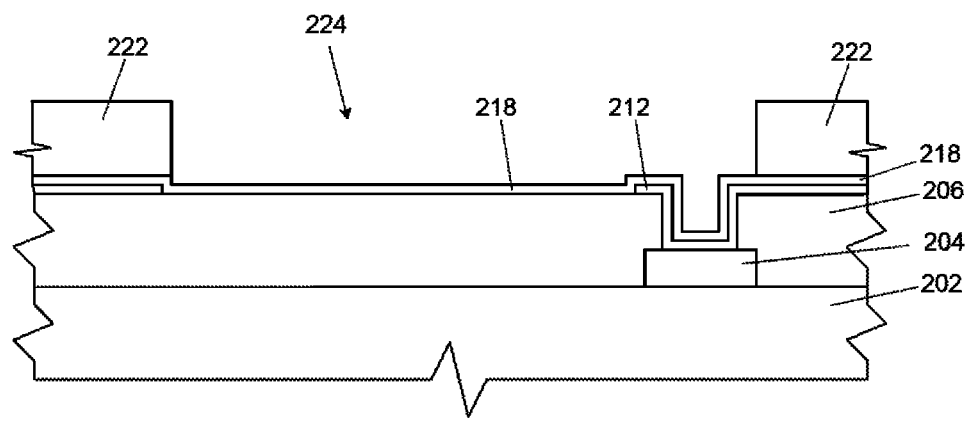

A second mask 222 may be patterned on the seed layer 218, as shown in FIG. 9 with a third opening 224 exposing a portion of the seed layer 218. The second mask 222 may be patterned in any manner known in the art including but not limited to known photolithography techniques with a photoresist material. The third opening 224 may be shaped in pattern desired for the subsequently formed interconnect, as will be discussed.

Figure 10:
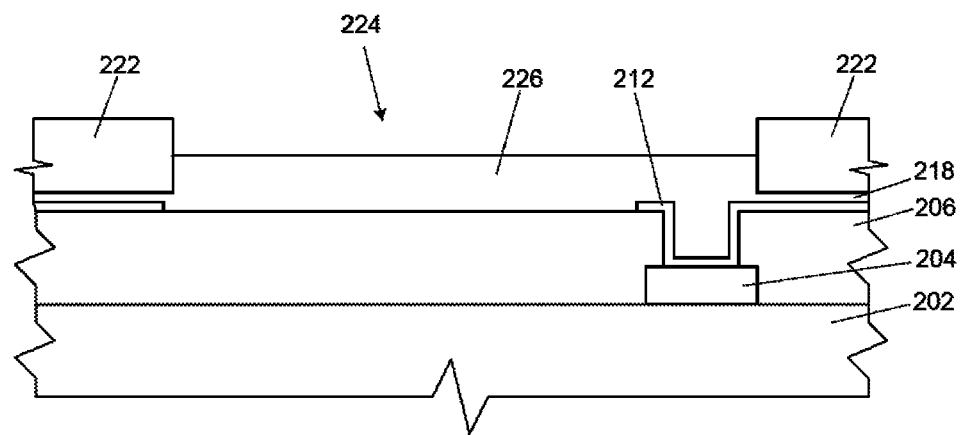

The assembly of FIG. 9 may be then plated with a conductive material, as shown in FIG. 10, thereby forming a plated area 226 within the third opening 224. The plating may be achieved by any know method known in the art, including but not limited to, electroless plating and electroplating. The conductive material may be a metal, including but not limited to copper, silver, aluminum, gold, and alloys thereof. The seed layer 218 abutting the plated area 226 may be subsumed therein.

Figure 11:
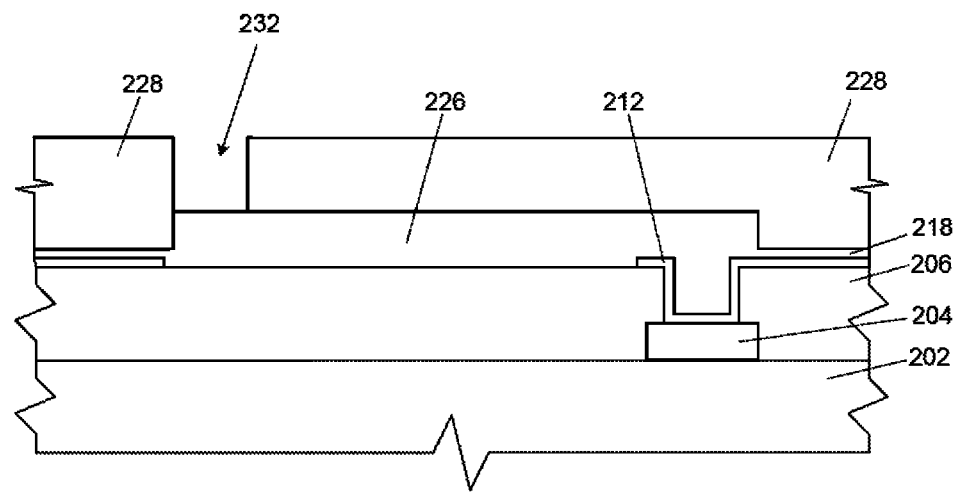

The second mask 222 may be removed by any known technique, such as by chemical stripping or ashing (oxygen and/or fluorine) and, as shown in FIG. 11, a third mask 228 may be patterned on the plated area 226 and the seed layer 218 with a fourth opening 232 exposing a portion of the plated area 226. The fourth opening 232 may be formed over the plated area 226 in a position a distance away from the first opening 208 (see FIG. 3). The third mask 228 may be patterned in any manner known in the art, including but not limited to, known photolithography techniques with a photoresist material.

Figure 12:
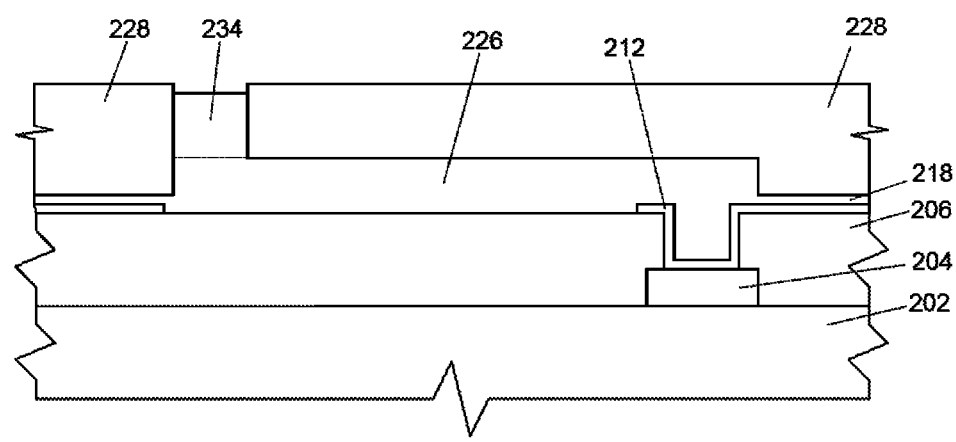

The assembly of FIG. 11 may then be plated with a conductive material, as shown in FIG. 12, thereby forming a contact projection 234 within the third opening 232. The plating may be achieved by any know method known in the art, including but not limited to, electroless plating and electroplating. The conductive material may be a metal, including but not limited to, copper, silver, aluminum, gold, and alloys thereof.

Figure 13:
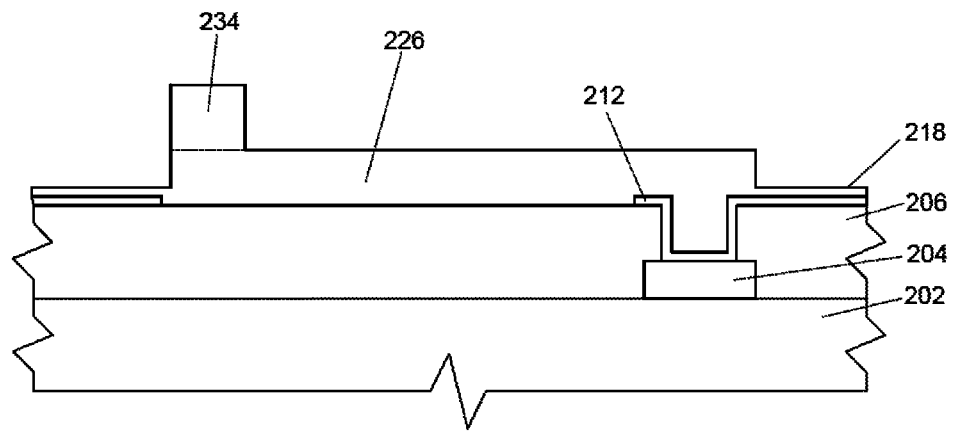
Figure 14:
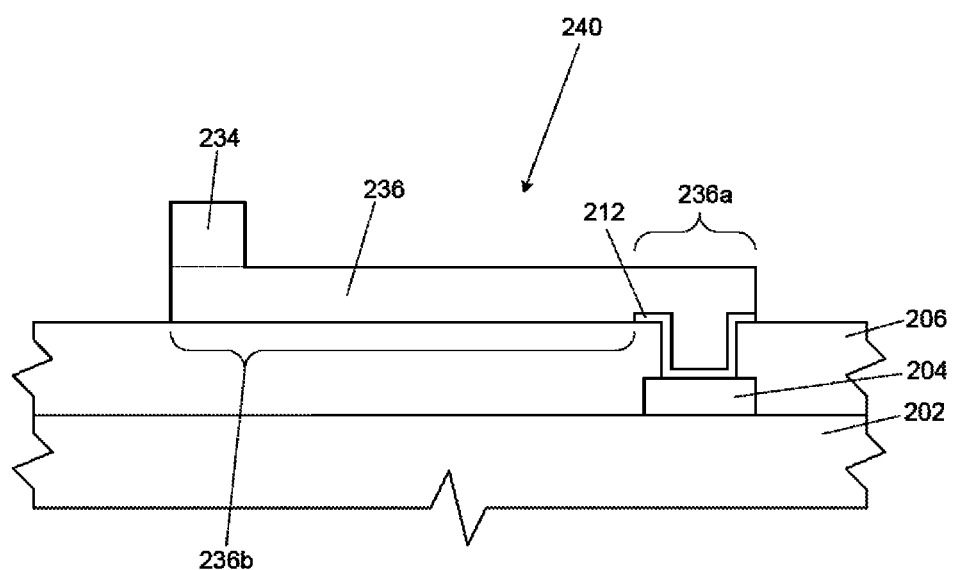

The third mask 228 may be removed by any known technique, such as by chemical stripping or ashing (oxygen and/or fluorine), as shown in FIG. 13. The seed layer 218 and portions of the conductive adhesion layer 212 not protected by the plated area 226 are then removed, such as by wet or dry etching techniques known in the art, to expose portions of the outer dielectric layer 206 and which forms an interconnect 240, as shown in FIG. 14, which comprises an interconnect extension 236 and the contact projection 234, with a first portion 236a of the interconnect extension 236 adhered to the conductive adhesion layer 212 and a second portion 236b of the adjacent the outer dielectric layer 206. In one embodiment, the interconnect extension 236 may be in a position substantially opposing the interconnect extension first portion 236a.

Figure 15:
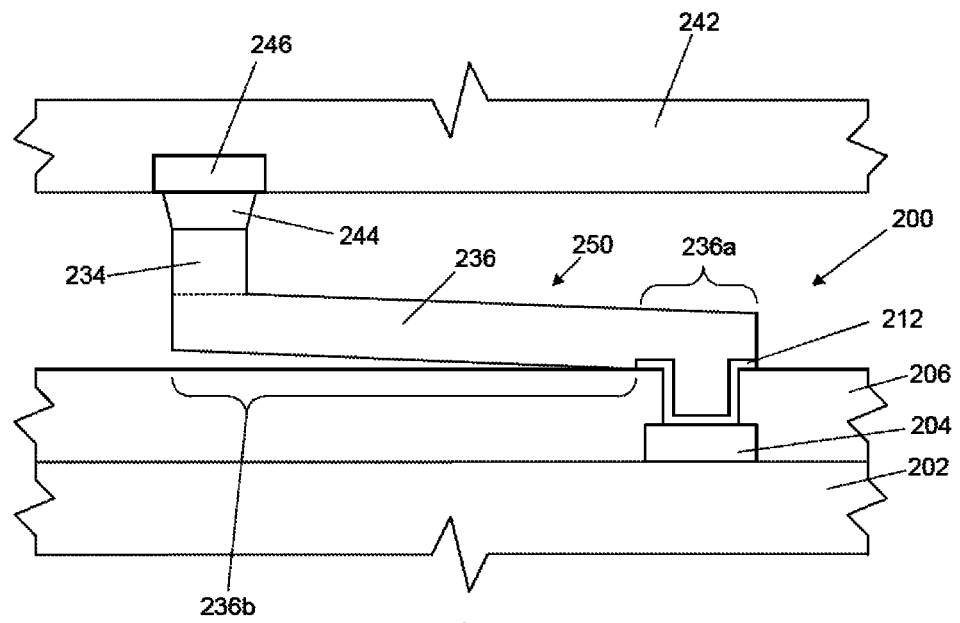
FIG. 15 is a side cross-sectional view of an interconnect of a microelectronic device attached to an external device.

As shown in FIG. 15, the microelectronic device 200 may be attached to an external device 242 by adhering the interconnect extension 236 to a bond pad 246 on the external device 242 with solder 244. The attachment by solder requires that the solder 244 to be heated to a reflow temperature, as will be understood to those skilled in the art. However, significant thermal mismatch stress may occur between the microelectronic device 200 and the external device 242 as they cool down from the reflow temperature of the solder 244. During this thermal mismatch period, if sufficient stress is imparted, the portion of the interconnect extension 236 not secured by the conductive adhesion layer 212 is capable of debonding from the outer dielectric 206, as shown. In other words, the adhesion between the interconnect extension 236 and the outer dielectric layer 206 is sufficiently weak that the interconnect extension 236 debonds from the outer dielectric layer 206 creating a spring-like debonded interconnect 250 with the interconnect extension first portion 236a secured to the microelectronic device 200 with the conductive adhesion layer 212.

This debonded interconnect 250 substantially reduces or eliminates stress being imparted on the microelectronic device 200, thereby substantially reducing or eliminating bump shear damage, low K interlayer dielectric damage, or any other stress related damage to the microelectronic device 200. Thus, the utilization of such an embodiment will allow for the use of relatively fragile ultra-low K interlayer dielectrics (dielectric constant values of less than 2.5), such as porous silicon dioxide and porous carbon doped silicon dioxide, as the dielectric layers throughout the microelectronic device 200.

In one embodiment, the materials for the outer dielectric layer 206 and interconnect extension 236 are selected so that the interconnect extension 236 does not debond from the outer dielectric layer 206 before the microelectronic device 200 is attached to the external device 242. In a specific embodiment, the outer dielectric layer 206 may be a photosensitive dielectric material, such as WPR™ available from JSR Micro, Sunnyvale, Calif., USA, or benzocyclobutene, such as Cyclotene® available from Dow Corporation, Midland, Mich., USA, and the interconnect extension 236 may be copper and alloys thereof.

Furthermore, as previously discussed with regard to FIG. 1, debonding may be generally localized near the periphery of the microelectronic device and may not propagate further into the center of the microelectronic device, since the stress at the die corners and edges of the microelectronic device decreases rapidly moving away from the edge. Therefore, there may not be a need to fabricate the debonded interconnects embodiments of present disclosure for the interior interconnects (e.g. interconnect within the dashed line 108 of FIG. 1). Thus, interior interconnects may be used to carry larger currents, thereby mitigating potential maximum current issues with the interconnects of the present disclosure, as will be understood to those skilled in the art.

Embodiments of the current disclosure may have significant advantages in the terms of handling of the microelectronic device 200 prior to attachment to the external device 242. In one embodiment, the adhesion between the interconnect extension 236 and the outer dielectric layer 206 is sufficient to not debond during the various production steps, such as probing, wafer thinning, dicing, and tape peeling, as the stress from such production steps can be at least 6 times lower than the stresses during cool down after the attachment of the microelectronic device 200 to the external device 242, as shown in Table 1.

TABLE 1

|  | Shear Stress (MPa) |
| --- | --- |
| Probing | ~10-20 MPa |
| Thinning | ~0.01-0.02 MPa |
| Dicing/peeling | ~5-15 MPa |
| Microelectronic Device Attachment | ~120-140 MPa |

Thus, in one embodiment of the present disclosure, the interconnect can be designed to have the interconnect extension 236 debond for the outer dielectric layer 206 at shear stresses greater than about 20 MPa. Moreover, since the interconnect extension 236 does not debond prior to attachment to the external device 242, no special handling of the microelectronic device 200 is necessary.

Embodiments of the current disclosure may also have significant advantages with regard to the package (i.e., the microelectronic device attached to the external device). Although a glue material may be used at a corner or edge of a microelectronic device to fix its position with regard to the external device at attachment, no underfill may be needed for stress reduction purposes, as the debonded interconnect can reduce stress over 50% without underfill. Furthermore, as will be understood to those skilled in the art, embodiments of the current disclosure can enable Direct Chip Attach (DCA).

Figure 16:
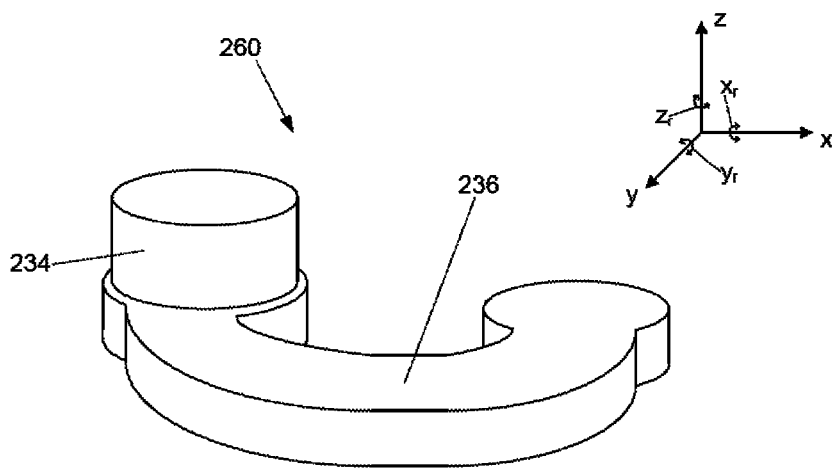
FIG. 16 is an oblique view of one embodiment of an interconnect.
Figure 17:
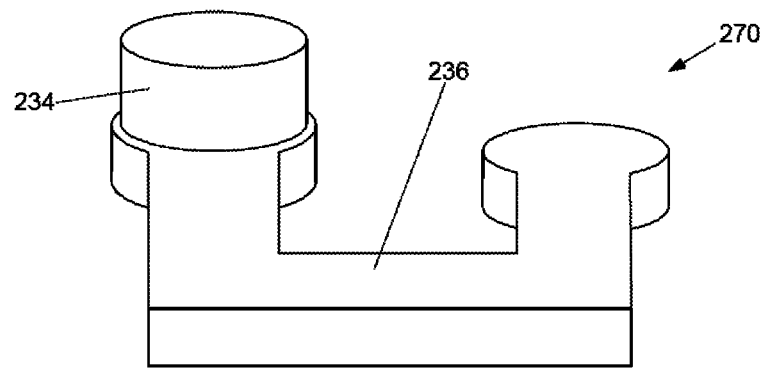
FIG. 17 is an oblique view of another embodiment of an interconnect.

It is understood that the interconnect extension 236 may have a variety of shapes, including non-linear shapes, in a planar relationship to the outer dielectric layer 206. As shown in FIG. 16, the interconnect extension 236 may have a curved or arcuate shape to form an arcuate interconnect 260. This curved shape allows for greater degrees of freedom for a flexing motion of the interconnect extension 236. In other words, when the interconnect extension 236 is non-linear, it is more capable of rotating about the X, Y, and/or Z axis, as illustrated as rotation motion $X_r$, $Y_r$, and $Z_r$ in FIG. 16. Having a greater degree of freedom of movement allows interconnect extension 236 to more easily flex in response to shear stresses after the interconnection extension 236 has debonded, as will be understood by those skilled in the art. It is, of course, understood that the interconnect extension 236 shape need not be curved to achieve a similar degree of freedom of movement, as a variety of shapes can be used. For example, the interconnect extension 236 may have angles to form an angular interconnect 270, as shown in the FIG. 17.

Figure 18:
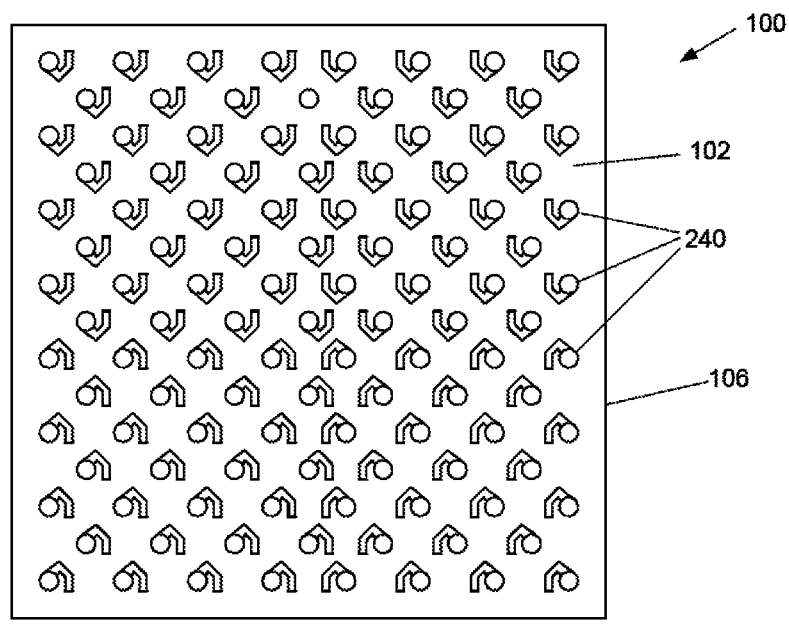
FIG. 18 illustrates a plan view of an attachment surface of a microelectronic device having interconnects of the present disclosure.

Although as previously discussed, the interconnects of the present disclosure may only need to be distributed proximate the periphery 106 of the microelectronic device 100, it is, of course, understood that, as shown in FIG. 18, the entire attachment surface 102 of the microelectronic device 100 may be populated with the interconnects 240 of the present disclosure.

Figure 19:
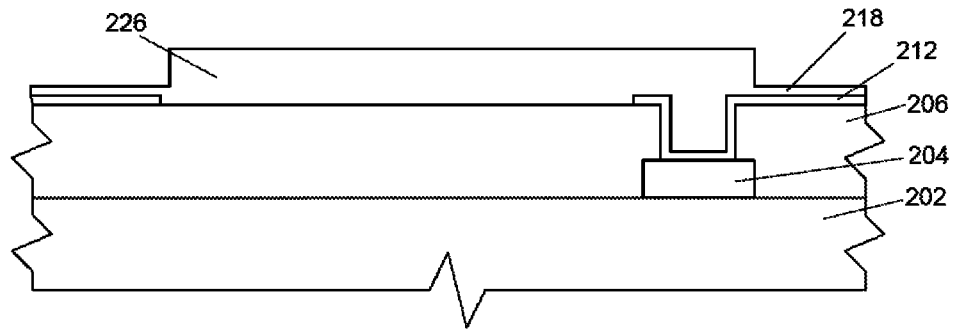
FIGS. 19-25 illustrate side cross-sectional views of another embodiment of a process of forming an interconnect.
Figure 20:
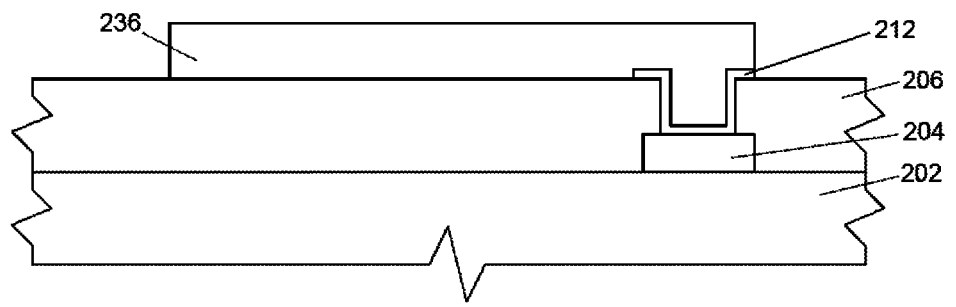
Figure 21:
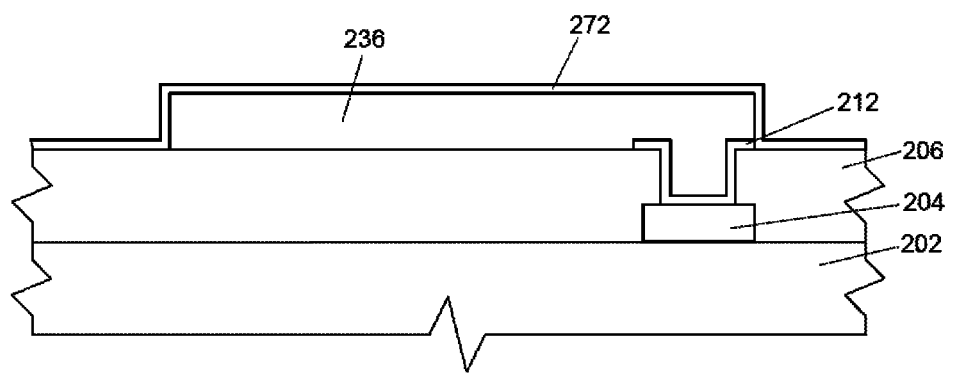

In another embodiment, as shown in FIGS. 19-25, the contact projection may be formed from a solder material. Beginning with FIG. 10, the second mask 222 may be removed, as shown in FIG. 19. As shown in FIG. 20, the seed layer 218 may be removed, such as by wet or dry etching techniques known in the art, to expose portions of the outer dielectric layer 206 and which forms the interconnect extension 236. As shown in FIG. 21, a solder retention layer 272, such as a silicon nitride layer, may be deposited over the interconnect extension 236 and the outer dielectric layer 206. The solder retention layer 272 may be deposited by any technique known in the art including, but not limited to, chemical vapor deposition, atomic layer deposition, physical vapor deposition, and the like.

Figure 22:
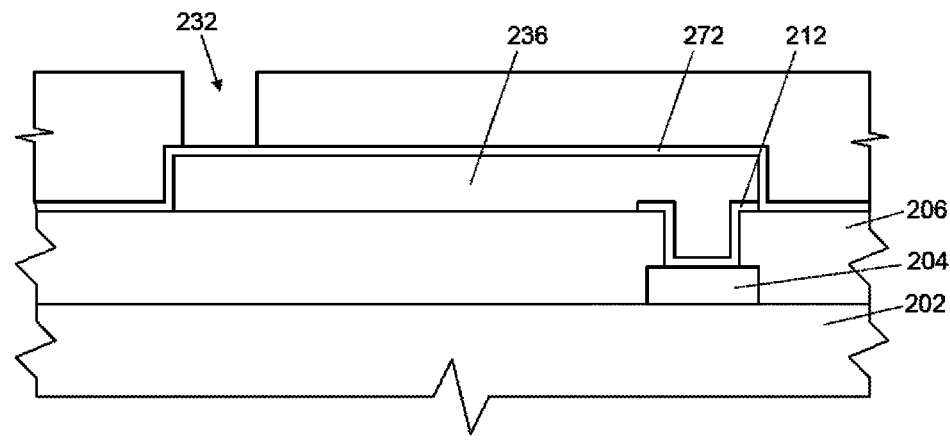

As shown in FIG. 22, the third mask 228 may be patterned on the solder retention layer 272 with the fourth opening 232 therethrough to expose a portion of the solder retention layer 272 on the interconnect extension 236. The fourth opening 232 may be formed in a position a distance away from the portion of the interconnect extension 236 that is adhered by the adhesion layer 212. The third mask 228 may be patterned in any manner known in the art including, but not limited to, known photolithography techniques with a photoresist material.

Figure 23:
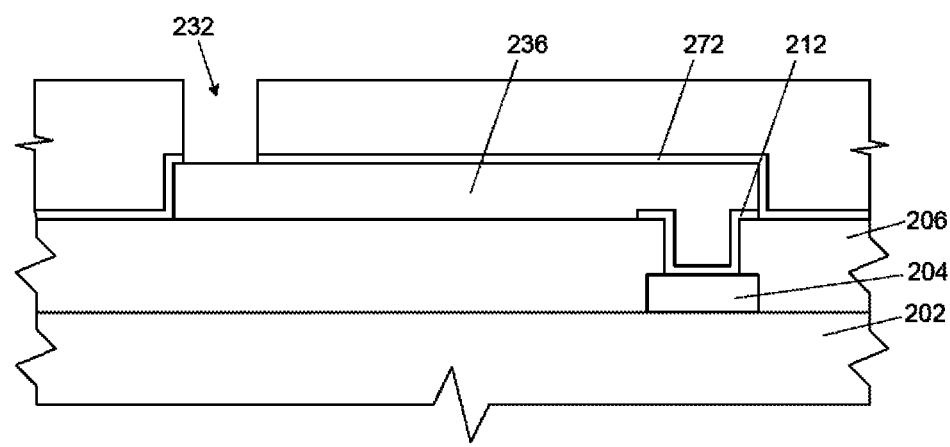
Figure 24:
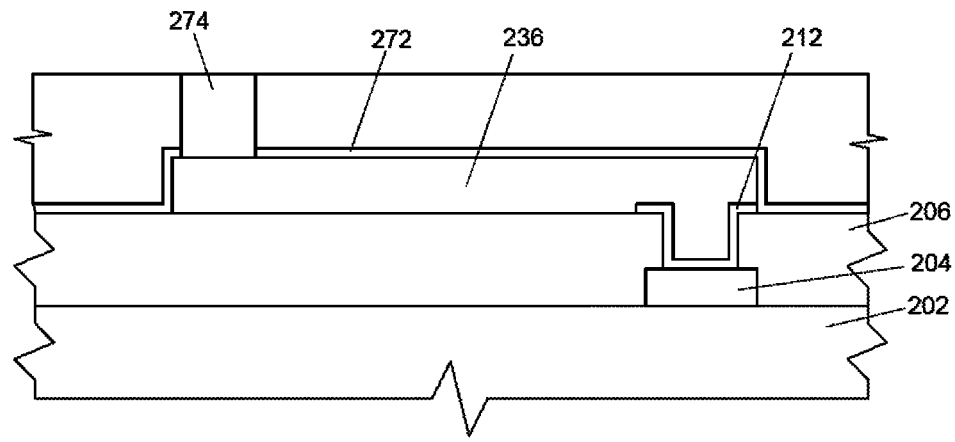

The exposed portion of the solder retention layer 272 within the fourth opening 232 may then be removed, such as by a wet or dry etch, to expose a portion of the interconnect extension 236, as shown in FIG. 23. As shown in FIG. 24, a solder paste material 274 may be disposed within the fourth opening 232 (see FIG. 23), by any method known in the art. The solder paste material 274 may be any appropriate material, including but not limited to, lead/tin alloys, such as 63% tin/37% lead solder, or lead-free solders, such a pure tin or high tin content alloys (e.g. 90% or more tin), such as tin/bismuth, eutectic tin/silver, ternary tin/silver/copper, eutectic tin/copper, and similar alloys.

Figure 25:
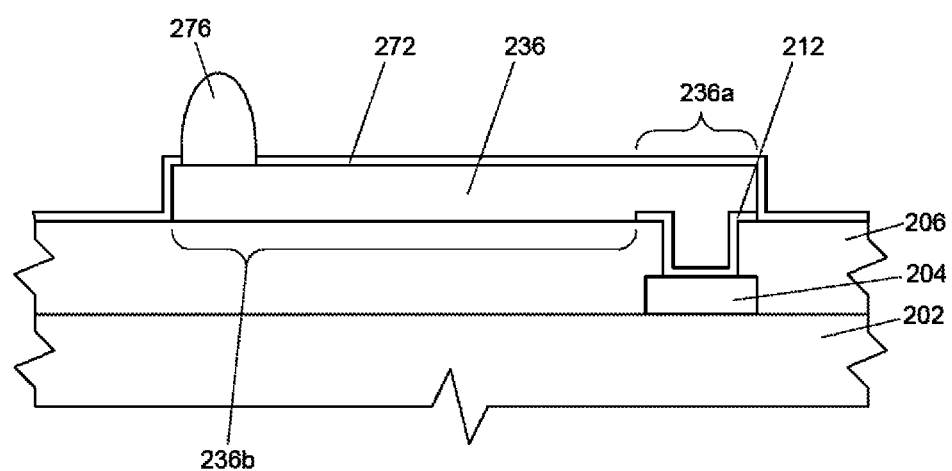

As shown in FIG. 25, the third mask 228 may be removed by any known technique, such as by chemical stripping or ashing (plasma in fluorine or oxygen), and the solder paste 274 reflowed to form a contact projection 276, thereby forming an interconnect 280. As will be understood to those skilled in the art, the solder retention layer 272 prevents the solder paste 274 (see FIG. 24) from spreading beyond the exposed portion of the interconnect extension 236 when the solder paste 274 is reflowed.

Figure 26:
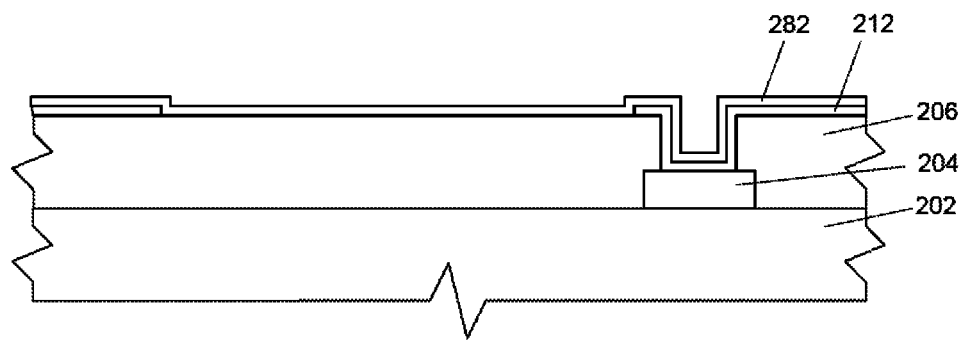
FIGS. 26-29 illustrate side cross-sectional views of still another embodiment of a process of forming an interconnect.
Figure 27:
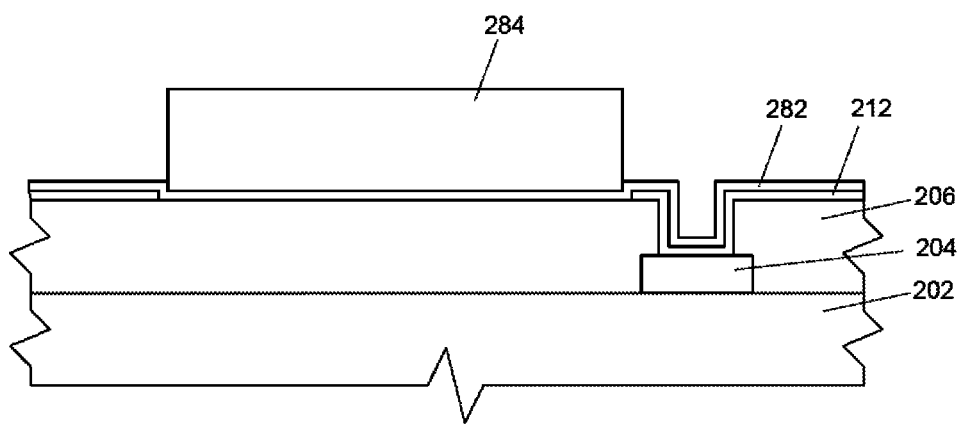
Figure 28:
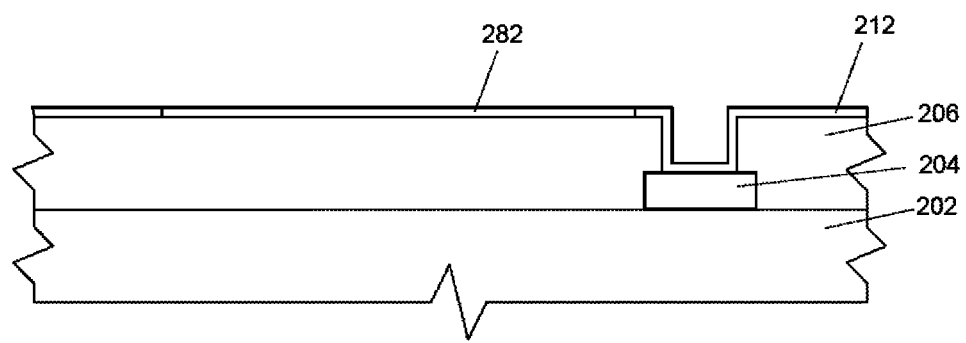

In other embodiment of the invention, as shown in the FIGS. 26-29, a release material layer may be disposed between the outer dielectric and the interconnect. Beginning at FIG. 7, a release material layer 282 may be deposited over the exposed portion of the outer dielectric layer 206 and the remaining conductive adhesion layer 212, as shown in FIG. 26. A release material layer mask 284 may be patterned on the release material layer 282, as shown in FIG. 27. The release material layer mask 284 may be patterned in any manner known in the art including, but not limited to, known photolithography techniques with a photoresist material. Exposed portions of the release material layer 282 may be removed, as such by wet or dry etching techniques. The release layer mask 284 may then be removed, by any known technique, such as by chemical stripping or ashing (plasma in oxygen or fluorine), as shown in FIG. 28.

The release material layer 282 may be formed from a variety of materials, including but not limited to carbon (wherein the adhesion characteristics of the carbon may be tuned depending on deposition conditions, as will be understood to those skilled in the art), noble metals, such as aluminum, and metal oxides, including but not limited to aluminum oxide, iron oxide, and the like. The metal oxide may be formed by sputter depositing the metal in the presence of oxygen gas.

Figure 29:
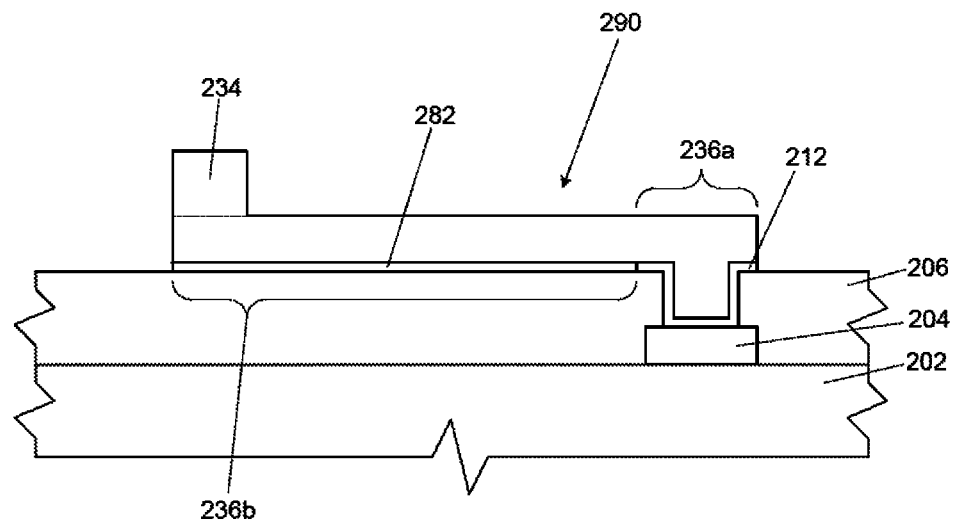

Processing steps, such as those described with regard to FIGS. 3-13, may be followed to result in an interconnect 290, as shown in FIG. 29, as will be understood to those skilled in the art, with the interconnect extension first portion 236a adhered to the conductive adhesion layer 212 and the interconnect extension second portion 236b adjacent the release layer 282. It is also understood that the processing steps with regard to FIGS. 19-25 may also be followed to result in an interconnect having a release layer 282 and solder contact projection 276. The release layer 282 may be used to tune the amount of stress that will be tolerated before debonding occurs. It is, of course, understood that the release layer 282 can debond from the outer dielectric layer, debond from the interconnect extension 236, or debond within itself.

Figure 30:
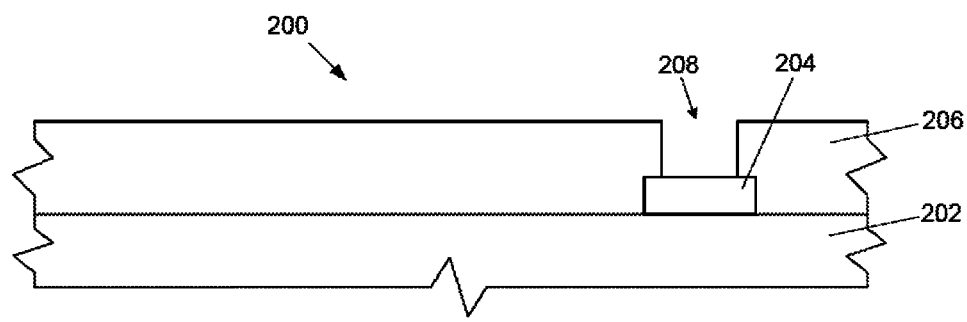
FIGS. 30-38 illustrate side cross-sectional view of yet still another embodiment of a process of forming an interconnect.

In yet other embodiment of the invention, as shown in the FIGS. 30-38, a release material layer may be disposed between the outer dielectric and the interconnect prior to the deposition of the adhesion layer. FIG. 30 illustrates the microelectronic device 200 comprising the first dielectric layer 202 having the conductive trace 204 thereon. The outer dielectric layer 206 may be formed over the first electric layer 202 and the conductive trace 204, wherein the first opening 208 extends through the outer dielectric layer 206 to expose a portion of the conductive trace 204.

Figure 31:
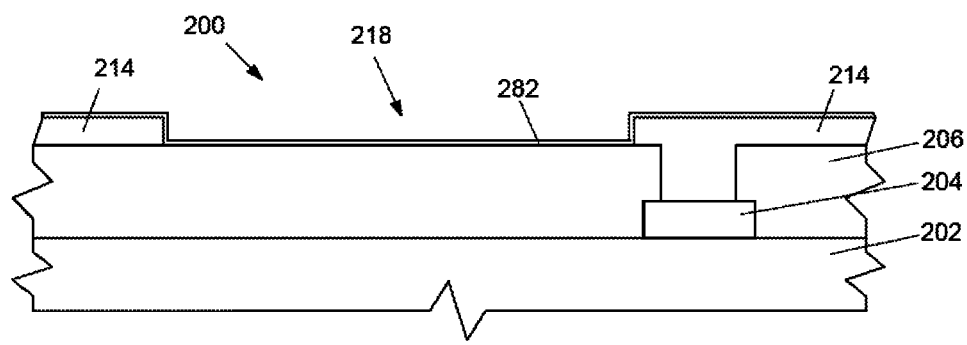
Figure 32:
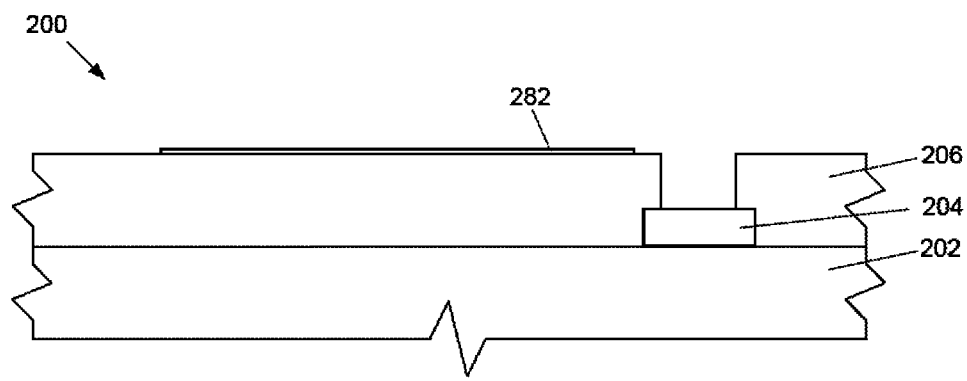
Figure 33:
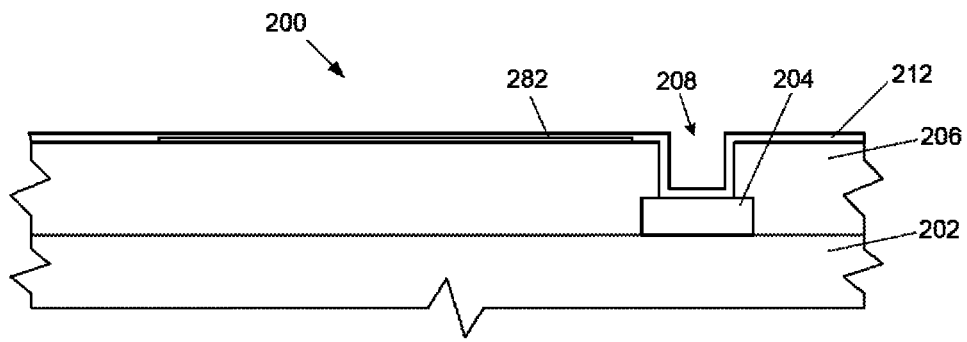
Figure 34:
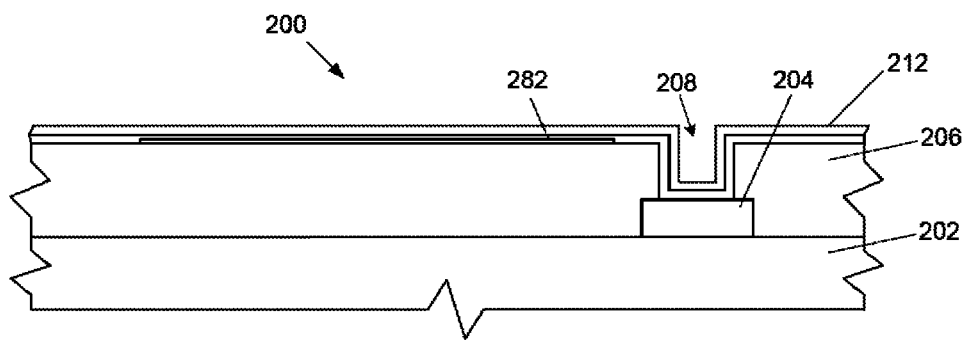

FIG. 31 illustrates the first mask 214 deposited on the first dielectric layer 202 and in the first opening 208, wherein the first mask 218 has the second opening 218 pattern therein to expose an portion of the outer dielectric layer 218. The release material layer 282 may be deposited on the patterned first mask 214 and exposed areas of the outer dielectric layer 206, as further shown in FIG. 31. As shown in FIG. 32, the first mask 214 may be removed to leave a release material layer 282 patterned on the outer dielectric layer 206. As shown in FIG. 33, the conductive adhesion layer 212 may be deposited over the release material layer 282, the outer dielectric layer 206, and in the first opening 208. As shown in FIG. 34, the seed layer 218 may be deposited over the exposed portions of the outer dielectric layer 206 and the remaining conductive adhesion layer 212.

Figure 35:
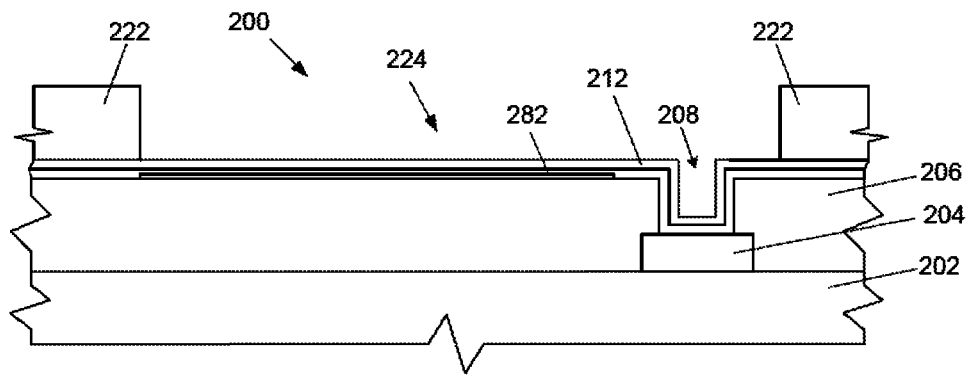
Figure 36:
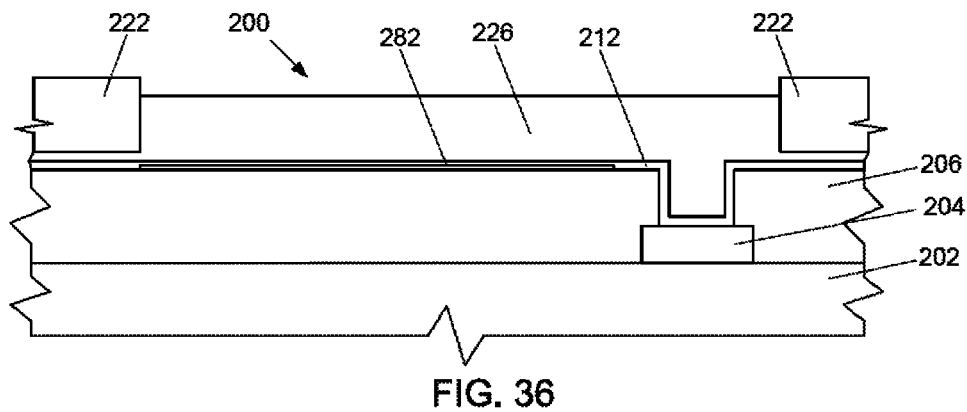
Figure 37:
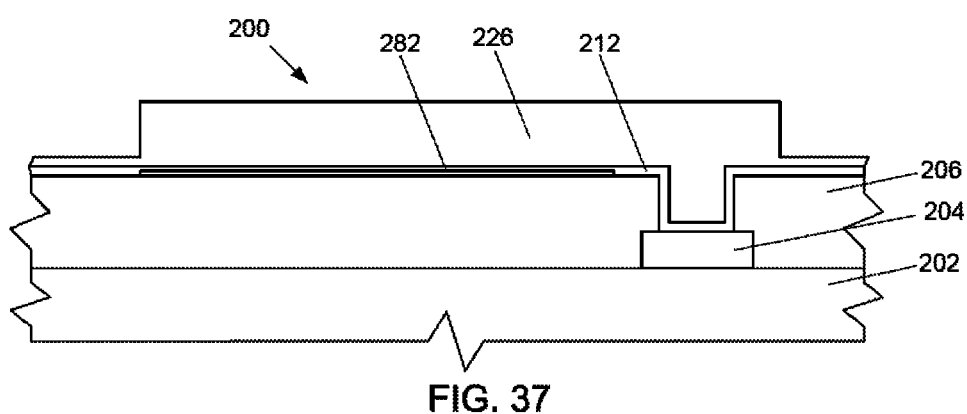
Figure 38:
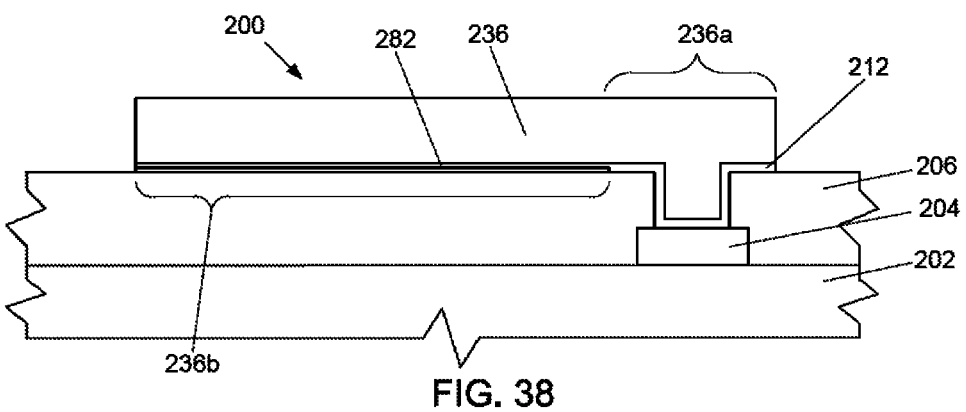

A second mask 222 may be patterned on the seed layer 218, as shown in FIG. 35 with a third opening 224 exposing a portion of the seed layer 218. The assembly of FIG. 35 may then be plated with a conductive material, as shown in FIG. 36, thereby forming a plated area 226 within the third opening 224. The second mask 222 may be removed, as shown in FIG. 37. As shown in FIG. 38, the seed layer 218 may be removed to expose portions of the outer dielectric layer 206 and which forms the interconnect extension 236. Processing steps, such as those described with regard to FIGS. 3-13 and in FIGS. 19-25, may be followed to result in an interconnect, such as those illustrated in the present disclosure.

Figure 39:
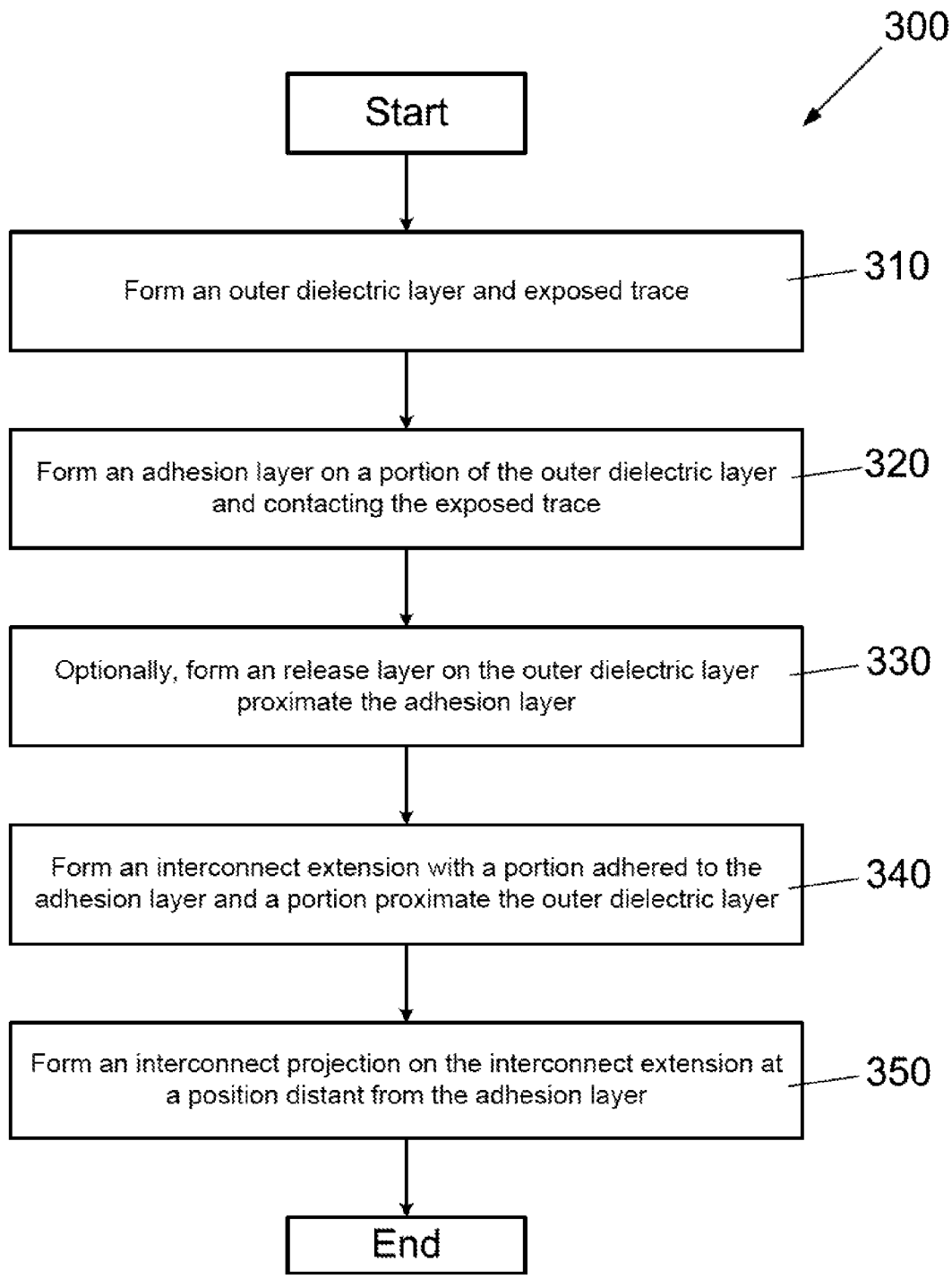
FIG. 39 is a flow diagram of an embodiment of a process of forming an interconnect.

FIG. 39 illustrates a flow chart of an embodiment of process 300 for fabricating a debonded interconnect. The process may begin by forming an outer dielectric layer and an exposed trace, as illustrated as block 310. An adhesion layer may be formed on a portion of the outer dielectric layer proximate to and contacting the exposed trace, as illustrated as block 320. An optional release layer may be formed on the outer dielectric layer proximate the adhesion layer, as shown in FIG. 330. An interconnect extension may be formed wherein a portion may be adhered to the adhesion layer and a portion may be proximate the outer dielectric layer, as illustrated as block 340. A contact projection may be formed on the interconnect extension at a position distant from the adhesion layer, as illustrated as block 350.

The detailed description has described various embodiments of the devices and/or processes through the use of illustrations, block diagrams, flowcharts, and/or examples. Insofar as such illustrations, block diagrams, flowcharts, and/or examples contain one or more functions and/or operations, it will be understood by those skilled in the art that each function and/or operation within each illustration, block diagram, flowchart, and/or example can be implemented, individually and/or collectively, by a wide range of hardware, software, firmware, or virtually any combination thereof.

The described subject matter sometimes illustrates different components contained within, or connected with, different other components. It is understood that such illustrations are merely exemplary, and that many alternate structures can be implemented to achieve the same functionality. In a conceptual sense, any arrangement of components to achieve the same functionality is effectively "associated" such that the desired functionality is achieved. Thus, any two components herein combined to achieve a particular functionality can be seen as "associated with" each other such that the desired functionality is achieved, irrespective of structures or intermediate components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

It will be understood by those skilled in the art that terms used herein, and especially in the appended claims are generally intended as "open" terms. In general, the terms "including" or "includes" should be interpreted as "including but not limited to" or "includes but is not limited to", respectively. Additionally, the term "having" should be interpreted as "having at least".

The use of plural and/or singular terms within the detailed description can be translated from the plural to the singular and/or from the singular to the plural as is appropriate to the context and/or the application.

It will be further understood by those skilled in the art that if an indication of the number of elements is used in a claim, the intent for the claim to be so limited will be explicitly recited in the claim, and in the absence of such recitation no such intent is present. Additionally, if a specific number of an introduced claim recitation is explicitly recited, those skilled in the art will recognize that such recitation should typically be interpreted to mean "at least" the recited number.

The use of the terms "an embodiment," "one embodiment," "some embodiments," "another embodiment," or "other embodiments" in the specification may mean that a particular feature, structure, or characteristic described in connection with one or more embodiments may be included in at least some embodiments, but not necessarily in all embodiments. The various uses of the terms "an embodiment," "one embodiment," "another embodiment," or "other embodiments" in the detailed description are not necessarily all referring to the same embodiments.

While certain exemplary techniques have been described and shown herein using various methods and systems, it should be understood by those skilled in the art that various other modifications may be made, and equivalents may be substituted, without departing from claimed subject matter or spirit thereof. Additionally, many modifications may be made to adapt a particular situation to the teachings of claimed subject matter without departing from the central concept described herein. Therefore, it is intended that claimed subject matter not be limited to the particular examples disclosed, but that such claimed subject matter also may include all implementations falling within the scope of the appended claims, and equivalents thereof.

What is claimed is:

1. A method of forming an interconnect, comprising:
    forming a dielectric layer with an opening therein to expose a conductive trace;
    forming a conductive adhesion layer on a portion of the dielectric layer and contacting the exposed conductive trace;
    forming an interconnect extension with a first portion adhered to the adhesion layer and a second portion proximate the dielectric layer;
    forming a metal oxide release layer between the interconnect extension second portion and the dielectric layer; and
    introducing stress to the interconnect extension to debond the interconnect extension second portion.

2. The method of claim 1 wherein introducing stress to the interconnect extension comprises introducing stress of greater than about 20 MPa.

3. The method of claim 1 wherein forming the interconnect extension comprises forming a copper-containing interconnect extension.

4. The method of claim 1 wherein forming a dielectric layer comprises forming a photosensitive dielectric material.

5. The method of claim 1 wherein forming a conductive adhesion layer comprising forming a titanium adhesion layer.

6. The method of claim 1 wherein forming a metal oxide release layer comprises forming an iron oxide.

7. The method of claim 1 wherein forming a metal oxide release layer comprises forming an aluminum oxide.

8. The method of claim 1 further comprising forming a contact projection on the interconnect extension second portion.

9. The method of claim 8 wherein forming the contact projection comprises forming a solder contact projection.

* * * * *

UNITED STATES PATENT AND TRADEMARK OFFICE
CERTIFICATE OF CORRECTION

PATENT NO. : 9,269,686 B2  
APPLICATION NO. : 14/132157  
DATED : February 23, 2016  
INVENTOR(S) : Ma et al.

Page 1 of 1

It is certified that error appears in the above-identified patent and that said Letters Patent is hereby corrected as shown below:

On the title page item (72), in column 1, in "Inventors", line 7, delete "Adryushchenko," and insert -- Andryushchenko, --, therefor.

Signed and Sealed this  
Second Day of August, 2016

Michelle K. Lee  
*Director of the United States Patent and Trademark Office*